United States Patent [19]

Roberts et al.

[11] Patent Number: 5,422,523

[45] Date of Patent: Jun. 6, 1995

[54] APPARATUS FOR TRANSLATING LOGIC SIGNAL LEVELS FROM 3.3 VOLTS TO 5 VOLTS

[75] Inventors: Meeling Roberts, Fremont; Ronald J. Mayer; Waleed S. Almulla, both of Folsom; Bradley G. Heaney, Mountain View; Gloria Leong, San Mateo, all of Calif.

[73] Assignee: Intel Corporation, Santa Clara, Calif.

[21] Appl. No.: 125,542

[22] Filed: Sep. 22, 1993

Related U.S. Application Data

[63] Continuation-in-part of Ser. No. 973,768, Nov. 9, 1992.

[51] Int. Cl.⁶ .......................................... H03K 5/003
[52] U.S. Cl. .................................... 326/68; 395/500
[58] Field of Search ............... 307/475, 362, 448, 451; 395/500

[56] References Cited

U.S. PATENT DOCUMENTS

| | | | |
|---|---|---|---|
| 3,959,666 | 5/1976 | Fett et al. | 307/475 |
| 3,974,402 | 8/1976 | Fett et al. | 307/475 |
| 4,656,373 | 4/1987 | Plus | 307/475 |
| 4,695,744 | 9/1987 | Giordano | 307/475 |
| 4,864,159 | 9/1989 | Cornelissen | 307/475 |
| 4,931,672 | 6/1990 | Khan | 307/475 |
| 4,978,870 | 12/1990 | Chen et al. | 307/475 |
| 4,996,443 | 2/1991 | Tateno | 307/475 |
| 5,047,672 | 9/1991 | Bhuva et al. | 307/425 |
| 5,144,165 | 9/1992 | Dhong et al. | 307/475 |
| 5,191,233 | 3/1993 | Nakano | 307/475 |
| 5,204,557 | 4/1993 | Nguyen | 307/475 |
| 5,225,721 | 7/1993 | Gal et al. | 307/475 |
| 5,241,225 | 8/1993 | Okajima et al. | 307/475 |
| 5,243,236 | 9/1993 | McDaniel | 307/475 |
| 5,250,856 | 10/1993 | Burton et al. | 307/475 |
| 5,266,849 | 11/1993 | Kitahara et al. | 307/475 |
| 5,311,075 | 5/1994 | Usuki | 307/475 |
| 5,311,083 | 5/1994 | Wanlass | 307/475 |

Primary Examiner—Alyssa H. Bowler
Assistant Examiner—Dan Fiul
Attorney, Agent, or Firm—Blakely, Sokoloff, Taylor & Zafman

[57] ABSTRACT

An apparatus having a 3.3 volt power supply and a 5 volt power supply, wherein digital signals are processed on a 3.3 volt basis which are translated to a 5 volt basis by a voltage translation circuit before being output. The voltage translator is comprised of an inverter for inverting an input signal. The inverter is powered by the 3.3 volt power supply. A p-channel transistor having its source coupled to the 5 volt power supply and its gate driven by the output of the inverter is implemented. When the inverter generates a low logic, the p-channel transistor is turned on and outputs 5 volts. An n-channel transistor having its source coupled to ground and its gate driven by the output of the inverter is also implemented. When the output of the inverter is 3.3 volts, the n-channel transistor is turned on, which pulls the output to ground. Therefore, when the input signal is at 3.3 volts, a 5 volt signal is output from the voltage translation circuit. When the input signal is at 0 volts, the output signal is, likewise, at 0 volts.

13 Claims, 4 Drawing Sheets

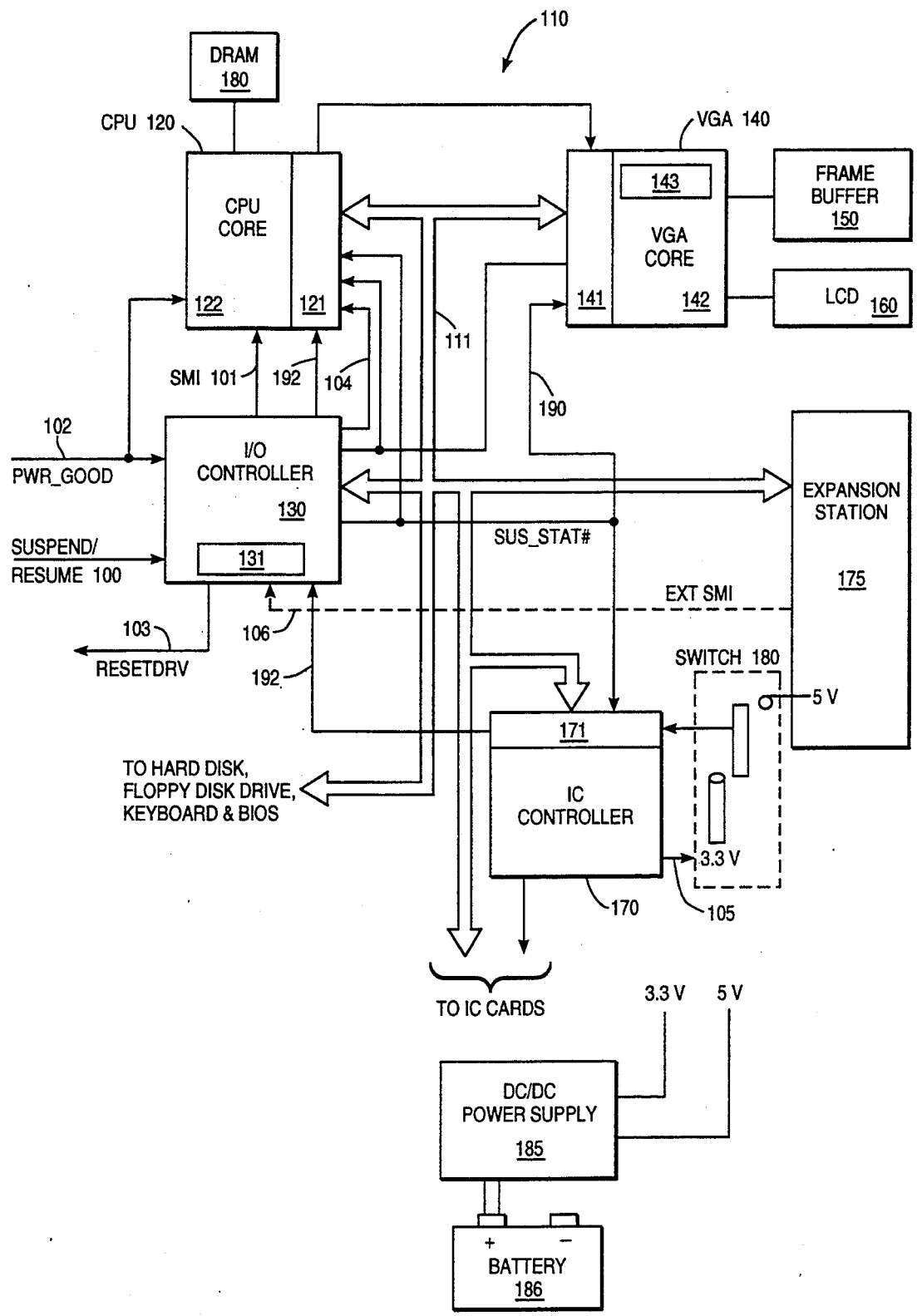
FIG_1

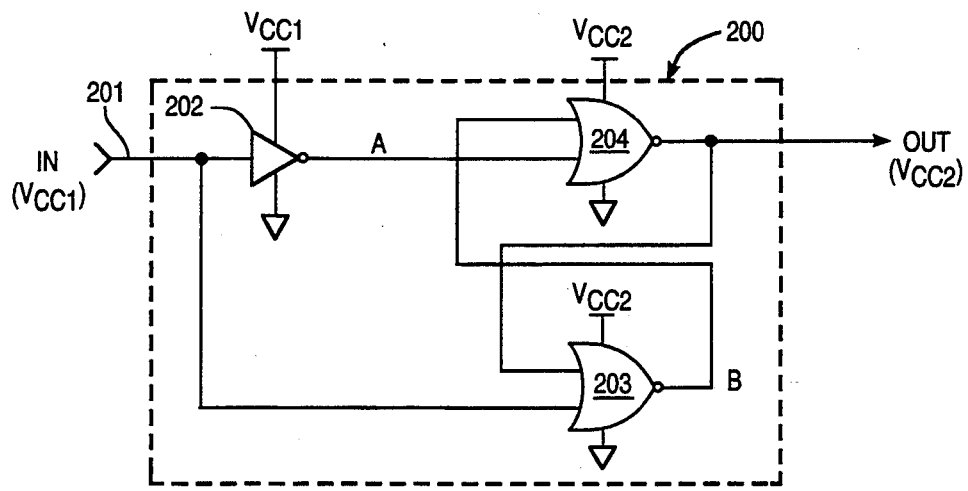
FIG_2
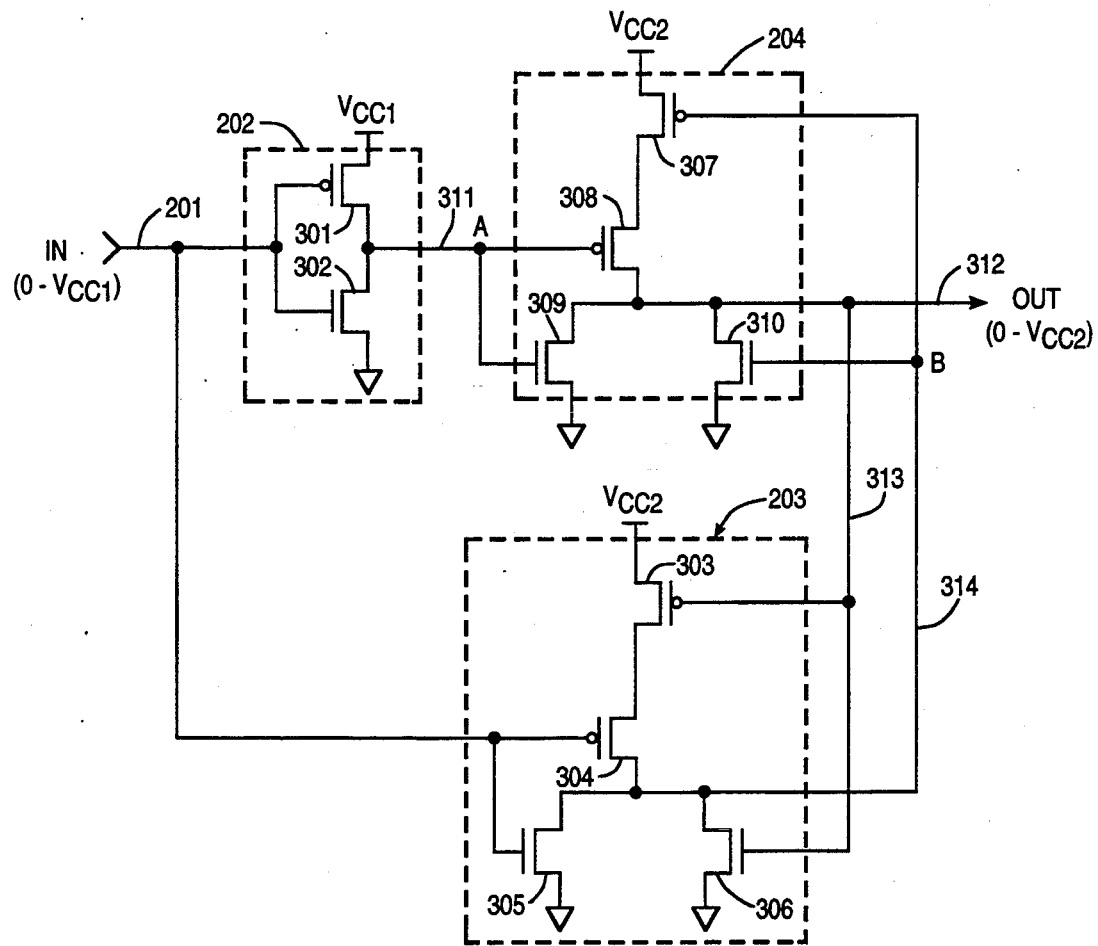
FIG_3

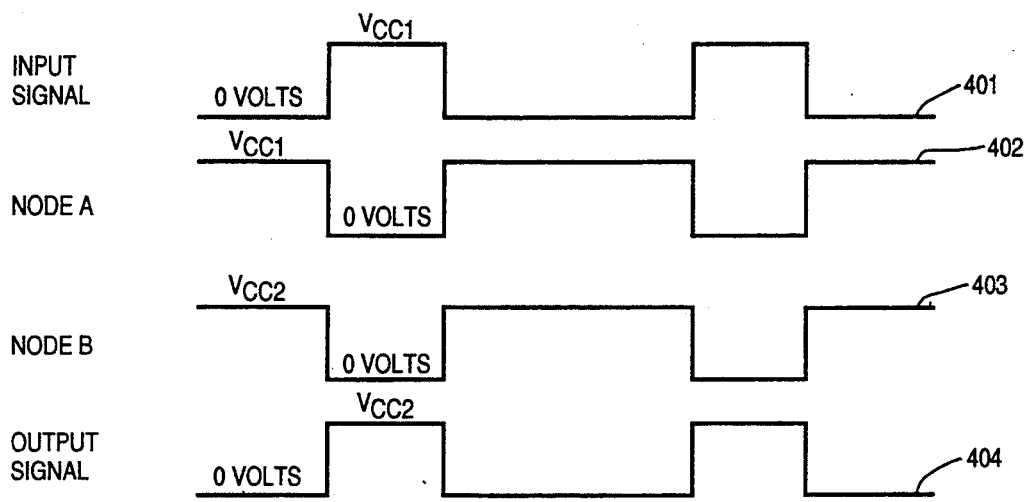
FIG_4
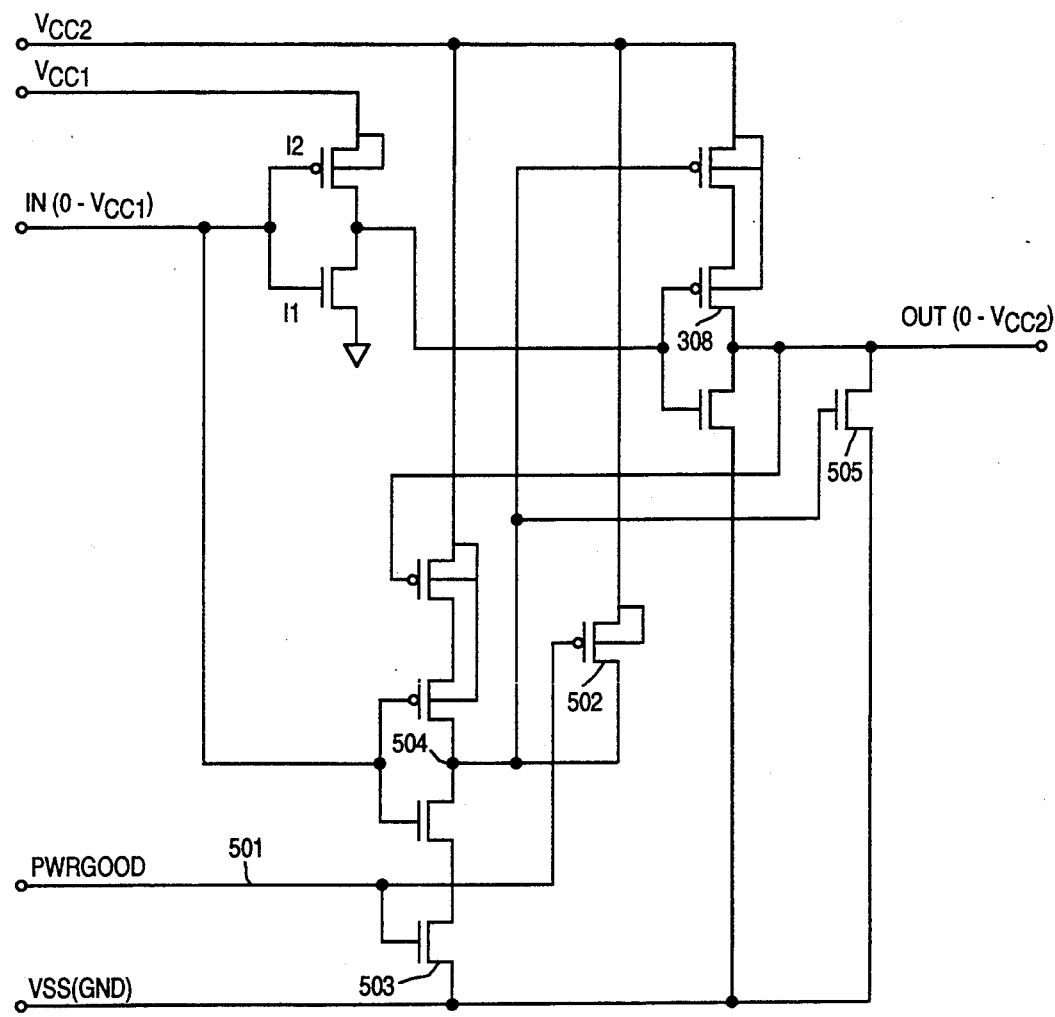
FIG_5

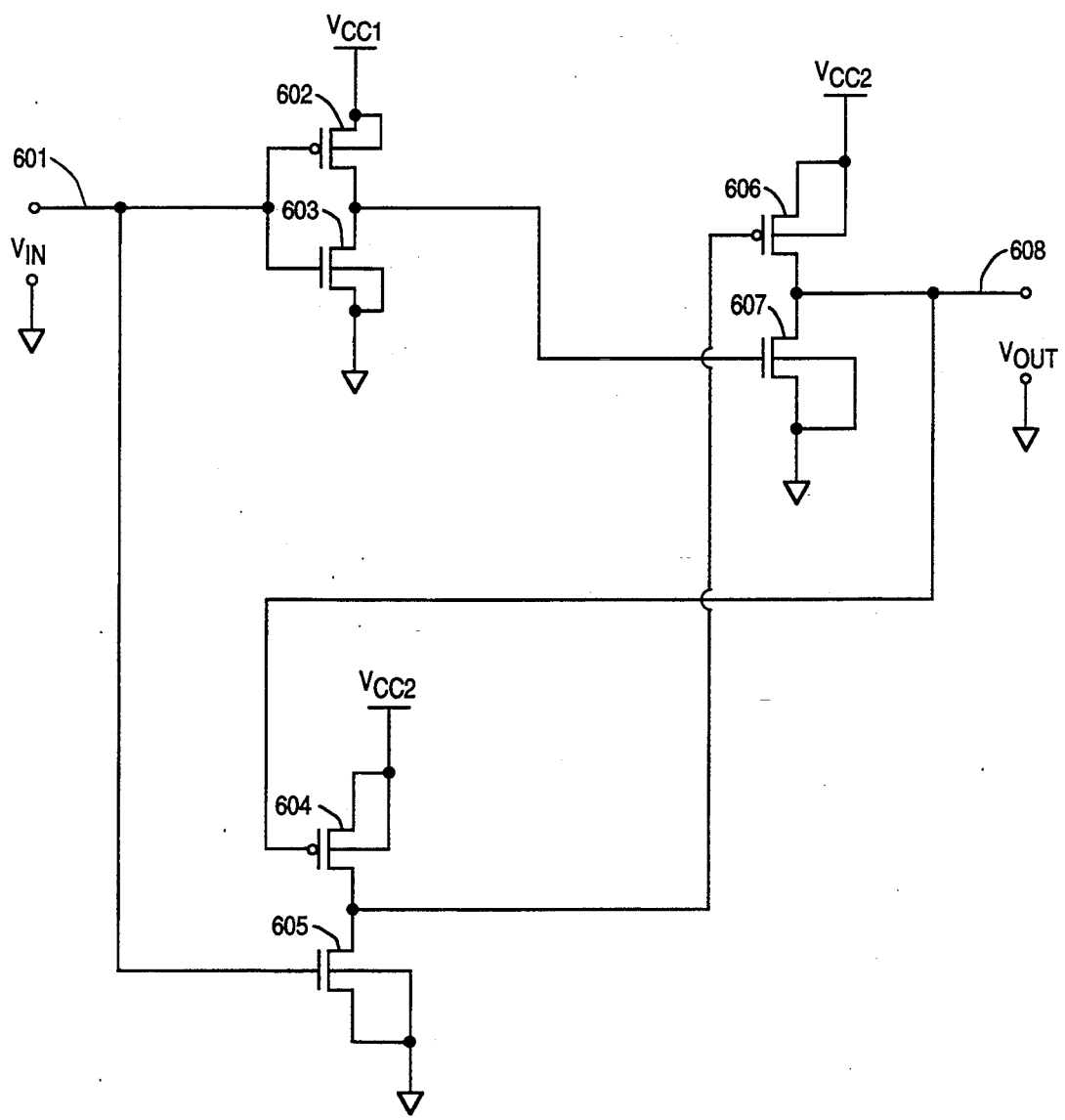
FIG_6

APPARATUS FOR TRANSLATING LOGIC SIGNAL LEVELS FROM 3.3 VOLTS TO 5 VOLTS

This application is a continuation-in-part of application Ser. No. 07/973,768, filed Nov. 9, 1992, and entitled APPARATUS AND METHOD FOR TRANSLATING LOGIC SIGNAL LEVELS.

FIELD OF THE INVENTION

The present invention pertains to the field of semiconductor devices. More particularly, the present invention relates to an apparatus and method for translating logic signals from one voltage level to a different voltage level.

BACKGROUND OF THE INVENTION

Advances in semiconductor fabrication and manufacturing techniques have led to extremely complex and compact semiconductor circuitry. Ever increasing numbers of transistors, gates and other types of components are being crammed into smaller and smaller silicon die sizes. The trend is towards even smaller, denser, and more complex semiconductor devices in the future.

However, one obstacle facing semiconductor designers is that physical limits are reached, wherein the p-n junctions of a semiconductor "break down." Basically, when a sufficiently high field is applied to a p-n junction, it breaks down and conducts a very large current. As the physical size of semiconductor components become smaller, they also become more susceptible to breaking down.

In order to mitigate this highly undesirable aspect, operating levels are being reduced from the present industry standard of 5 volts to a lower level of 3.3 volts. A lower operating voltage level reduces the chances of semiconductor junction break downs.

Another driving force behind changing the operating level from 5 volts to 3.3 volts is to decrease a semiconductor's power consumption. Semiconductors which can operate on less power are highly advantageous. This is especially true for use in battery powered equipment, such as laptop computers. An equivalent laptop computer fashioned from 3.3 volt semiconductors would typically operate longer than one fashioned from 5 volt semiconductors, given identical battery supplies. In other words, battery operated equipment would not have to be recharged as often if 3.3 volt, rather than 5 volt semiconductor chips, were to be implemented. Furthermore, the lifetime of a battery would be extended by adopting devices which require less power.

Consequently, the goal is to eventually phase out the 5 volt standard and to produce and support a whole family of semiconductor devices based on a 3.3 volt reference. However, this transition from 5 volts to 3.3 volts will be a long, slow, and arduous process. And even once a 3.3 volt standard is eventually recognized and supported, portable computers may be designed such that they run at a low voltage normally (i.e., 3.3 volts) and at a higher voltage when connected to a docking station (i.e., 5 volts).

Further complicating matters is the fact that, at present, there is no widely established industry bus standard based on a 3.3 volt level. Conflicting bus architectures and formats could cause incompatibilities between various 3.3 volt devices. It will take some time to develop a specification for a 3.3 volt bus similar to the one existing for the 5 volt bus as defined by the Instrument Society of America (ISA) specification. Hence, developers face a dilemma in choosing which of the various 3.3 volt bus schemes to support.

One approach is to implement the bulk of a semiconductor chip to operate on a 3.3 volt basis, while maintaining the I/O interface at a 5 volt basis. In this manner, battery consumption is reduced, battery life is extended, and the chip is compatible with the established 5 volt ISA bus specification. In order to implement such a scheme, the 5 volt input signals must first be translated to a 3.3 volt level. After signal processing has been completed, the processed 3.3 volt signals are then translated back to a 5 volt level for output.

One prior art scheme for translating between 3.3 and 5 volts, calls for the implementation of a separate, dedicated external bus controller (EBC). The EBC is used to provide the necessary buffering, handshaking, and translation operations. In addition, the EBC also acts as an arbitrator. All input signals are received through the EBC, and all processed signals are sent through the EBC.

Implementing an EBC helps reduce the chances of latch-up. Furthermore, impact ionization problems caused by carriers gaining enough energy to excite electron-hole pairs as the electric field in a semiconductor is increased above a certain value, are minimized. Moreover, an EBC eliminates D.C. current problems. If a 3.3 volt signal is used to drive a 5 volt device, it would cause that device to draw D.C. power, since it is neither fully on nor fully off. This problem is not as serious for desktop applications, but minimizing DC current dissipation is of prime concern for laptop and notebook applications.

However, this scheme suffers from several disadvantages. These disadvantages range from increased costs due to circuit complexity and hardware overhead to increasing the physical size of the printed circuit board in order to accommodate the additional EBC chip. Furthermore, the EBC scheme mandates that a myriad of added interconnections be implemented for coupling each of the different signal paths.

Therefore, what is needed is a simple, cost-effective mechanism for translating voltage signal levels which can be implemented within a small silicon die size, while minimizing latch-up, impact ionization, and D.C. current problems. It would also be highly preferable for the translator mechanism to be adaptable so that it can be implemented on an as needed basis rather than being restricted to I/O buffers.

SUMMARY AND OBJECTS OF THE INVENTION

In view of the problems associated with interfacing devices operating on different voltage levels, one object of the present invention is to provide an apparatus and method for translating signal levels to provide compatibility between these devices.

Another object of the present invention is to provide a simple, effective voltage level translation mechanism while minimizing the amount of silicon area used.

Another object of the present invention is to reduce power consumption and extend battery life in laptop and notebook computers by minimizing D.C. current dissipation.

Another object of the present invention is to minimize the chances for latch-up and impact ionization conditions.

Another object of the present invention is to prevent floating nodes and buffer contention during initial power-up, power-down, and system reset.

Yet another object of the present invention is to provide a mechanism for translating signals from 3.3 volts to 5 volts, without requiring the use of a separate chip and which is not restricted to being implemented in only I/O buffers.

These and other objects of the present invention are implemented in a microprocessor which accepts 5 volt digital signals. In order to conserve power and increase efficiency, most of the processing is performed on a 3.3 volt basis. Thereupon, a voltage translation is performed to convert the processed 3.3 volt signals to a 5 volt level for outputting.

The voltage translation circuit of the present invention can be implemented in a number of different cross-coupled feedback configurations. A simplified version of the currently preferred configuration is comprised of an inverter and a pair of NOR gates having two inputs. The inverter is coupled to the 3.3 volt power supply, whereas the two NOR gates are coupled to the 5 volt supply. The processed 3.3 volt signal is input to the inverter and to one of the inputs of the second NOR gate. The signal from the inverter is input to one of the inputs of the first NOR gate. The output from the first NOR gate is fed back to the second input to the second NOR gate. Similarly, the output from the second NOR gate is fed back to the second input of the first NOR gate.

The output signal from the voltage translator is that generated by the first NOR gate. Thus, when the input signal is at 3.3 volts, the output from the translator circuit is at 5 volts. When the input voltage is at 0 volts, the output from the translator circuit is also at 0 volts.

In one embodiment, two CMOS inverters and two cross-coupled gates are utilized. The cross-coupled gates use regenerative feedback to quickly pull the output signal to full voltage. This circuit can also be de-activated during power up to limit the transient current consumption.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1 is a block diagram of a computer system upon which the preferred embodiment of the present invention may be utilized.

FIG. 2 is a circuit diagram illustrating one configuration for implementing the voltage level translation circuit of the present invention.

FIG. 3 is a transistor-level circuit diagram illustrating the currently preferred configuration of the translation circuit of the present invention.

FIG. 4 is a timing diagram illustrating a sample input signal and the corresponding output signal along with the signals at various nodes of the translation circuit of the present invention.

FIG. 5 is a circuit diagram illustrating the voltage translation circuit which includes circuitry for disabling the translation circuit upon initial power-up, power-down, and system reset until the power supplies have stabilized.

FIG. 6 is a circuit diagram illustrating an alternative embodiment of the present invention employing two CMOS inverters and two cross-coupled gates.

DETAILED DESCRIPTION

A voltage level translator for converting the bits of a digital signal from one voltage level to a higher voltage level is described. In the following description, for purposes of explanation, numerous specific details are set forth, such as certain voltages, timing diagrams, transistor configurations, etc., in order to provide a thorough understanding of the present invention. It will be obvious, however, to one skilled in the art that the present invention may be practiced without these specific details. In other instances, well-known structures and devices are shown in block diagram form in order to avoid unnecessarily obscuring the present invention.

The present invention is advantageously employed in a computer system design optimized for applications with low power consumption and compact size. Such applications particularly include small battery-powered personal computers of the type commonly referred to as laptops and notebooks. One preferred embodiment of such a computer system is briefly described below; however, it is to be understood that the present invention is not limited to this particular computer system design and may be incorporated into virtually any processor-based system design.

Referring to FIG. 1, a computer system 110 upon which the preferred embodiment of the present invention may be practiced is shown. Computer system 110 includes a 486SL ™ microprocessor manufactured by Intel Corporation, the assignee of this invention. Such a computer system is compatible with the IBM ™ PCAT Personal Computer. System 110 comprises three main processor components which are designated as the central processing unit (CPU) 120, input/output (I/O) controller 130, and VGA 140. These components are coupled to bus 111 upon which signals are transmitted between the various components coupled to bus 111.

Referring to FIG. 1, CPU 120 is an expanded central processing unit including a core 122 comprised of a CPU, a memory controller, a cache controller and bus control logic and line buffers 121. Core 122 operates at a 3.3 volts level. Buffers 121, however, are capable of operating at multiple power supply levels. Buffers 121 are capable of operating both 3.3 volts and 5 volts. Buffers 121 are also capable of translating voltage signals between bus 111 and core 122. When interface bus 111 operates at 5 volts, buffers 121 translate the signals from interface bus 111 into 3.3 volt signals, which are then supplied to core 122. Likewise, signals from core 122 supplied to interface bus 111, are be translated from 3.3 to 5 volts. The voltage level of the power supply is indicated to buffers 121 via line 192.

CPU 120 is also coupled to receive a PWR_GOOD signal via line 102. This signal indicates whether the power supply is at an acceptable operating level (i.e., functional voltage level). The PWR_GOOD signal causes an asynchronous global reset of CPU 120 when it is de-asserted (i.e., set inactive). The PWR_GOOD signal also disables (i.e., tri-states) CPU buffers 121.

A CPURESET signal on line 104, a SUS_STAT signal on line 190, a System Management Interrupt (SMI) interrupt signal on line 101, and a REFREQ signal on line 191 are also coupled to CPU 120 from IO controller 130. When the CPURESET signal on line 104 goes active, it causes CPU 120 to execute its reset sequence. Note that CPU 120 does not exit the powered down state until both the CPURESET and the PWR_GOOD signals are both inactive (i.e., the power is at a functional level and the reset sequence has been executed). The SUS_STAT signal on line 190 indicates that computer system 110 is in a suspended state (i.e., mode). The SUS_STAT signal on line 190 may be used by other peripherals in the system to determine whether the system is in a suspended state. The SMI interrupt signal is a transparent system interrupt. CPU 120 enters system management mode when receiving the SMI interrupt on line 101. In system management mode, the interrupt is handled using an interrupt routine in a manner well-known in the art.

A system memory 180 is coupled to CPU 120. System memory 180 substantially comprises a Dynamic Random Access Memory (DRAM) devices for storing digital data.

IO controller 130 is an input/output (I/O) unit comprising parallel ports, dual serial ports, real-time clock unit, dual programmable interrupt controller, power management module dual programmable timers, dual DMA controllers, memory mapper and I/O buffers. IO controller 130 also contains register 131 used to command IO controller 130 for transitioning to the suspend mode.

Integrated circuit card (IC) controller 170 is coupled to bus 111 for interfacing CPU 120 with changeable IC memory cards. Controller 170 also contains buffers 171 which are capable of operating at multiple power supply levels, either 3.3 or 5 volts. The power supply level indication signal on line 192 is coupled to controller 170 from switch 180.

VGA 140 is a single chip graphics interface comprising VGA core 142 and buffers 141. VGA core 142 includes a VGA graphics controller and a video memory controller. VGA 140 also contains register 143 which is used to command VGA 140 to transition to the suspend or resume mode. VGA core 142 operates at a single power supply level, 3.3 volts. VGA buffers 141 operate at multiple power supply levels, either 3.3 or 5 volts.

A flat panel display unit 160 is also coupled to VGA 140. An oscillator (not shown) for refreshing video frame buffer (i.e., video memory) DRAM 150 is also coupled to the VGA 140. Frame buffer 150 substantially comprises DRAM devices. The REFREQ signal on line 191 and the SUS_STAT signal on line 190 are also received by VGA 140.

Subsystems are coupled to and communicate with one another and with other system components (e.g., expansion slots keyboard controller, disc controller, etc.) via interface bus 111, such as an AT compatible bus. In addition, hard disk drives, floppy ..disk drives, a keyboard and a basic input/output system (BIOS) controller can be coupled to bus 111. Interface bus 111 operates at either 3.3 volts or 5 volts.

The operating potential of computer system 110 and interface bus 111 is capable of changing when expansion station 175 is coupled to interface bus 111. Expansion station 175 is an interface for peripherals to computer system 110. Expansion station 175 is capable of interfacing peripherals which operate at a different power supply potential than computer system 110. In other words, expansion station 175 is capable of providing an interface with slots for peripherals which require power supply voltages different from that of the computer system.

The translation circuit of the present invention can be implemented in any of several different cross-coupled feedback configurations. When an input signal having one voltage level (i.e., $V_{cc1}$) is to be translated into a desired different voltage level (i.e., $V_{cc2}$), cross-coupled feedback is employed to couple the output path to the desired, $V_{cc2}$, voltage level. Thereby, this allows the output signal to be at the desired voltage level, $V_{cc2}$. When the input signal is 0 volts (i.e., "low"), the output signal immediately goes to 0 volts. In the following description, 3.3 volts and 5 volts are offered as examples for demonstrating how the present invention can be implemented. Other voltage levels can equally be applied to the present invention.

FIG. 2 is a circuit diagram illustrating the currently preferred configuration of the translation circuit 200. An input signal on line 201 having levels of either 0 volts or $V_{cc1}$ representing data bits (i.e., "0" and "1") is coupled to the input of inverter 202. The output from inverter 202 is coupled to one of the two inputs of NOR gate 204. The input signal is also coupled to one of the two inputs to NOR gate 203. Note that the NOR gates 203–204 are comprised of NAND gates. The output from NOR gate 204 is cross-coupled and fed back as an input to NOR gate 203. Similarly, the output of NOR gate 203 is cross-coupled and fed back as an input to NOR gate 204. The output signal from NOR gate 204 is the output from translator 200. Inverter 202 is powered by $V_{cc1}$, whereas NOR gates 203 and 204 are powered by $V_{cc2}$. In this manner, input signals at a $V_{cc1}$ voltage level are translated to a $V_{cc2}$ voltage level. For example, if $V_{cc1}$ is set to 3.3 volts and $V_{cc2}$ is set to 5 volts, the 3.3 volt signals are translated into 5 volts.

FIG. 3 is a transistor-level circuit diagram illustrating the currently preferred embodiment of the translation circuit. Inverter 202 is comprised of p-channel transistor 301 and n-channel transistor 302. NOR gate 203 is comprised of two p-channel transistors 303 and 304 and two n-channel transistors 305 and 306. Likewise, NOR gate 204 is comprised of two p-channel transistors 307 and 308 and two n-channel transistors 309 and 310.

The input signal (0 volts to $V_{cc1}$) on line 201 is coupled to the gates of transistors 301, 302, 304, and 305. The output from inverter 202 on line 311 is coupled to the gates of transistors 308 and 309. The output 312 from NOR gate 204 is coupled to the gates of transistors 303 and 306 by feedback path 313. Similarly, the output from NOR gate 203 is coupled to the gates of transistors 307 and 310 by feedback path 314. Consequently, the outputs from NOR gates 203 and 204 are cross coupled and respectively fed back as inputs to one another. The source of transistor 301 is coupled to $V_{cc1}$. The sources of transistors 303 and 307 is coupled to $V_{cc2}$.

The translation circuit operates as follows. In general, a low logic level on the gate of a p-channel transistor turns it "on" and causes it to conduct current. The opposite effect occurs when a high logic level is put on the gate of a p-channel transistor. That is, the p-channel transistor is turned "off," and no current is conducted conversely, for an n-channel transistor, a low logic level on its gate turns the transistor "off," whereas a high voltage level on its gate turns it "on."

Consequently, if the input signal is a logic 1 (i.e., a high voltage level, such as 3.3 or 5 volts), transistor 301 is turned off, and transistor 302 is turned on. This pulls node A down to ground (i.e., 0 volts). A low level signal at node A turns on transistor 308 and turns off transistor 309. At the same time, the high level input signal turns on transistor 305 and turns off transistor 304. This immediately causes node B to be pulled down to ground. Effectively grounding node B causes transistor 307 to be turned on and transistor 310 to be turned off. Because transistors 307 and 308 are both on while transistors 309 and 310 are both off, the drain of transistor 308 is at a $V_{cc2}$ voltage level. Since the output from the translation circuit is coupled to the drain of transistor 308, the output is, likewise, at $V_{cc2}$. Note that the $V_{cc2}$ on the drain of transistor 308 is also supplied to the gates of transistors 303 and 306. Thereby, p-channel transistor 303 is turned off and n-channel transistor 306 is turned on.

When the input signal is at 0 volts, no translation occurs. The function of the translation circuit is to ensure that the output signal is also at 0 volts. The way in which the translation circuit ensures that the output is at 0 volts when the input signal goes to 0 volts is as follows. An input of 0 volts turns on transistor 301 and shuts off transistor 302. Hence, node A is at a $V_{cc1}$ voltage level. This causes the transistor 308 to be turned off while transistor 309 is turned on. Note that $V_{cc1}$ voltage need only be greater than the threshold of transistor 309 (i.e., approximately 0.6 volts) for the transistor to be switched on. Consequently, transistor 309 effectively couples the output signal to ground. In addition, zero volts on the input turns on transistor 304 and turns off transistor 305. Since the output is being pulled to ground by transistor 309, transistor 303 is turned on while transistor 306 is turned off. The overall effect is to put $V_{cc2}$ onto node B when the input signal is at 0 volts. In turn, this causes transistor 307 to be turned off and transistor 310 to be turned on. Thereby, transistor 310 better grounds the output signal when the input signal is at 0 volts.

Table 1 illustrates the states of each of the transistors for an input signal at 0 and $V_{cc1}$ volts.

TABLE 1

| Transistor | Transistor Status Input Signal Voltage Level | |
|---|---|---|
| | 0 Volts | Vcc1 |
| 301 | ON | OFF |
| 302 | OFF | ON |
| 303 | ON | OFF |
| 304 | ON | OFF |
| 305 | OFF | ON |
| 306 | OFF | ON |
| 307 | OFF | ON |
| 308 | OFF | ON |
| 309 | ON | OFF |
| 310 | ON | OFF |

FIG. 4 is a timing diagram illustrating the input and output voltage levels along with the voltage levels at nodes A and B. It can be seen that at node A, the input signal 401 has been inverted, 402 (i.e., 0 volts is converted to $V_{cc1}$ while $V_{cc1}$ is converted to 0 volts). The signal 403 at node B is at a $V_{cc2}$ voltage level. The output signal 404 is the translation of the input signal 401 from $V_{cc1}$ and $V_{cc2}$.

Table 2 illustrates a truth table for the present invention.

TABLE 2

| Truth Table | |
|---|---|
| INPUT | OUTPUT |
| 0 volts | 0 volts |
| $V_{cc1}$ volts | $V_{cc2}$ volts |

It should by noted that transistors 306 and 310 are not absolutely necessary for the present invention to translate to input signal from a $V_{cc1}$ to a $V_{cc2}$ voltage level. However, transistors 306 and 310 are implemented in the present invention in order to provide more stability. They are used to aid in achieving the 0 and Vcc voltage levels more solidly. For example, in the $V_{cc1}$ to $V_{cc2}$ translation process, either of transistors 305 and 306 can pull node B low to turn on transistor 307. In cases where the input signal is at 0 volts, either of transistors 309 and 310 can pull the output signal down to ground level. In summary, the basic concept involves cutting off D.C. current flow until the voltage levels have stabilized. This not only minimizes D.C. current problems, but also helps avoid under-driven gates and over-driven p-n junctions, thereby minimizing latch-up and hot electron concerns.

In the currently preferred embodiment of the present invention a signal, PWRGOOD, is used during initial power-up sequencing to prevent floating nodes and buffer contention. Note that since two different power supplies, $V_{cc1}$ and $V_{cc2}$, are being implemented, both of these power supplies must be at their high voltage levels before normal operating cycles can be initiated in order to ensure reliable performance. The PWRGOOD signal is generated by a circuit different from that of the voltage translation circuit to indicate when both supplies are at their respective high levels (e.g., 3.3 and 5 volts). In other words, the PWRGOOD signal is low when one or both of the power supplies are still ramping up. This occurs during power-up, power-down, and system reset. Once the two power supplies reach and maintain their high levels, the PWRGOOD signal is switched to a high level. When the power supplies are ramping up to voltage levels, a number of the circuit nodes of the semiconductor chip are either floating or at unknown states. Also during initial power up, I/O buffers might initially be enabled. If one buffer is driving high while another buffer is driving low, this creates contention. Floating nodes and buffer contention can cause high D.C. currents that could prevent the power supplies from ramping. They can also cause rapid battery drain. The PWRGOOD signal is used to disable the voltage translation circuit upon initial power-up until both power supplies reach their respective high levels. Thereupon, the PWRGOOD signal enables the voltage translation circuit. In the present invention, the enables corresponding to the I/O buffers comes from the voltage translation circuit. By disabling the voltage translation circuit, the I/O buffers are, likewise, disabled.

FIG. 5 is a circuit diagram illustrating the currently preferred embodiment of the voltage translation circuit incorporating the PWRGOOD signal as an enable. Two transistors 502 and 503 are added to enable and disable the voltage translator circuit according to the PWRGOOD signal on line 501. When the PWRGOOD signal is low (i.e., 0 volts), p-channel transistor 502 is turned on and n-channel transistor 503 is turned off. With transistor 502 being on, $V_{cc2}$ is put on node 504. Therefore, a low PWRGOOD signal disables the voltage translation circuit. Conversely, when the PWRGOOD signal is high, transistor 502 is turned off and transistor 503 is turned on. This enables the voltage translation circuit.

FIG. 6 is a circuit diagram showing an alternative embodiment of the present invention. In this embodiment, cross-coupled gates use regenerative feedback to quickly pull the output signal to full voltage. Transistors 602, 604, and 606 are p-channel transistors, while transistors 603, 605, and 607 are n-channel transistors. An input signal of 0 volts and $V_{CC1}$ volts is input on line 601. The input signal on line 601 is coupled to the gates of transistors 602, 603, and 605. Transistors 602 and 603 effectively perform the function of an inverter. The output from this inverter is coupled to the gate of transistor 607. The output on line 608 from transistors 606 and 607 is fed back to the gate of transistor 604. The output of transistors 604 and 605 on line 609 is fed back as an input to the gate of transistor 606. The source of transistor 602 is coupled to $V_{CC1}$ while the sources of transistors 604 and 606 are coupled to $V_{CC2}$. The sources of transistors 603, 605, and 607 are coupled to ground. The drains of transistors 602 and 603 are coupled together and also coupled to the gates of transistor 607. The drains of transistors 604 and 605 are coupled together and also coupled to the gate of transistor 606. The drains of transistors 606 and 607 are coupled together and also coupled to the output line 608.

The operation of this is now described in detail. When the input signal is 0 volts, transistor 602 is turned ON and transistor 603 is turned OFF. Thereby, $V_{CC1}$ is coupled to the gate of transistor 607, which turns it ON. This effectively grounds the output and also turns transistor 604 ON. given an input voltage of 0 volts, transistor 605 is turned OFF. consequently, $V_{CC2}$ is coupled to the gate of transistor 606 which turns it OFF. Therefore, a 0 volt input signal results in a 0 volt output signal.

If the input signal is $V_{CC1}$, this would turn transistor 602 OFF, and transistor 603 is turned ON. As a result, the gate of transistor 607 is effectively grounded, which turns it OFF. Given an input signal of $V_{CC1}$, transistor 605 is turned ON. This effectively grounds the gate of transistor 606, which turns it ON. Consequently, $V_{CC2}$ is output on line 608. Furthermore, $V_{CC2}$ is coupled to the gate of transistor 604 which turns it OFF. Therefore, an input signal of $V_{CC1}$ produces an output signal of $V_{CC2}$.

Thus, an apparatus and method for translating a signal from one voltage level to a different, higher voltage level is disclosed.

What is claimed is:

1. In a computer system having an input buffer for inputting signals having a first potential, a processor for processing said signals at a second potential which is less than said first potential, and an output buffer for outputting a processed signal at said first potential, wherein said processed signal has been processed by said processor, a translator coupled between the processor and the output buffer for translating said processed signal from said second potential to said first potential, said translator comprising:

an inverter powered at said second potential for inverting said processed signal, wherein said inverter outputs a signal at said second potential when said processed signal is at a low potential and a signal at a low potential when said processed signal is at said second potential;

a first NOR gate powered at said first potential having a first input for accepting an output signal from said inverter;

a second NOR gate powered at said first potential having a first input for inputting said processed signal;

a first feedback for coupling an output from said first NOR gate to a second input of said second NOR gate;

a second feedback for coupling an output from said second NOR gate to a second input of said first NOR gate, wherein when said processed signal is at said second potential, said first NOR gate outputs said first potential and when said processed signal is at said low potential, said first NOR gate outputs said low potential.

2. The translator of claim 1 further comprising a transistor for disabling said translator, immediately following power-up, power-down, and reset operations until said first potential and said second potential are achieved.

3. The translator of claim 2, wherein said first potential is approximately 5 volts and said second potential is approximately 3 volts.

4. In a computer system having an input means for inputting signals at a first potential, a processing means for processing said signals at a second potential which is less than said first potential, and an output means for outputting a processed signal at said first potential, wherein said processed signal has been processed by said processor, a translating means for translating said processed signal from said second potential to said first potential, said translating means comprising:

an inverting means powered at the second potential for inverting said process signal, wherein said inverting means outputs a signal at said second potential when said process signal is at a low potential and a signal at a low potential is output when said process signal is at said second potential;

a first NOR gate means powered at said first potential having a first input for accepting an output signal from said inverting means;

a second NOR gate means powered at said first potential having a first input means for inputting said processed signal;

a first feedback means for coupling an output from said first NOR gate means to a second input means of said second NOR gate means;

a second feedback means for coupling an output means from said second NOR gate means to a second input means of said first NOR gate means, wherein when said process signal is at said second potential, said first NOR gate means outputs said first potential and when said process signal is at said low potential, said first NOR gate means outputs said low potential.

5. The translating means of claim 4 further comprising a transistor means for disabling said translating means upon power-up, power-down, and reset operations.

6. The translating means of claim 5, wherein said first potential is approximately 5 volts and said second potential is approximately 3 volts.

7. In a computer system including a first power supply for supplying power at a first potential and second power supply for supplying power at a second potential, a translation circuit for translating a digital signal from the first potential to the second potential, comprising:

an inverter coupled to the first power supply, a third potential, and coupled to receive the digital signal, wherein the inverter operates to output an inverted digital signal at the third potential if the digital signal is at the first potential, and wherein the inverter operates to output the inverted digital signal at the first potential if the digital signal is at the third potential;

a first gate coupled the second power supply and a fourth potential, the first gate having a first input coupled to receive the inverted digital signal, a second input, and a first output coupled to a node, wherein the first gate operates to set the node at the second potential if the inverted digital signal is at the third potential, and wherein the first gate operates to set the node at the fourth potential if the inverted digital signal is at the first potential; and a second gate coupled to the second power supply and a fifth potential, the second gate having a third input coupled to receive the digital signal, a fourth input coupled to the node, and a second output coupled to the second input of the first gate such that the first gate and the second gate are in a cross-coupled feedback configuration.

8. The translation circuit of claim 7, wherein the first gate comprises:

a first transistor coupled to the first input, the second power supply, and the node for setting the node at the second potential in response to receiving the inverted digital signal at the third potential; and a second transistor coupled to the first input, the fourth potential, and the node, the second transistor for setting the node at the fourth potential in response to receiving the inverted digital signal at the first potential;

a third transistor coupled to the second input, the second power supply, and the first transistor, the third transistor for selectively coupling and decoupling the second power supply to the first transistor in response to a potential of the second input;

and the second gate comprises:

a fourth transistor coupled to the third input, the second power supply, and the second output for setting the second output at the second potential in response to receiving the digital signal at the third potential; and a fifth transistor coupled to the third input, the fifth potential, and the second output, the second transistor for setting the second output at the fifth potential in response to receiving the digital signal at the first potential; and a sixth transistor coupled to the fourth input, the second power supply, and the fourth transistor, the third transistor for selectively coupling and decoupling the second power supply to the fourth transistor in response to a potential of the fourth input.

9. The translation circuit of claim 7, wherein the first gate comprises:

a first transistor coupled to the second input, the second power supply, and the node for setting the node at the second potential in response to the second output being at the fifth potential; and a second transistor coupled to the first input, the fourth potential, and the node, the second transistor for setting the node at the fourth potential in response to receiving the inverted digital signal at the first potential;

and the second gate comprises:

a third transistor coupled to the fourth input, the second power supply, and the second output for setting the second output at the second potential in response to the fourth input being at the fourth potential; and a fourth transistor coupled to the third input, the fifth potential, and the second output, the second transistor for setting the second output at the fifth potential in response to receiving the digital signal at the first potential.

10. The translation circuit of claim 7, wherein the first potential is approximately 3.3 volts, the second potential is approximately 5.0 volts, and the third, fourth, and fifth potentials are all ground.

11. A circuit for converting a digital signal from a first potential to a second potential, comprising:

an inverter coupled to receive the digital signal, the inverter for generating an inverted digital signal, wherein the inverted digital signal is at a low potential if the digital signal is at the first potential, and wherein the inverted digital signal is at the first potential if the digital signal is at the low potential;

a first NOR gate having a first input coupled to receive the inverted digital signal, a second input, and an output for outputting the digital signal at the second potential if the inverted digital signal is at the low potential and for outputting the digital signal at the low potential if the inverted digital signal is at the first potential; and a second NOR gate having a third input coupled to receive the digital signal, a fourth input coupled to the output of the first NOR gate, and an output coupled to the second input of the first NOR gate.

12. The circuit of claim 11, wherein the first NOR gate comprises:

a first transistor coupled to the second potential for setting the output of the first NOR gate to the second potential when the inverted digital signal is at the low potential;

a second transistor coupled to the low potential for setting the first output to the low potential node when the inverted digital signal is at the first potential;

a third transistor coupled to the first transistor, the second potential, and the output of the second NOR gate for selectively supplying said second potential to said first transistor in response to potential of the output of the second NOR gate; and a fourth transistor coupled to the low potential and the output of the second NOR gate for selectively setting the first output to the low potential in response to the potential of the output of the second NOR gate.

13. The circuit of claim 12, wherein the second NOR gate comprises:

a fifth transistor coupled to the second potential for setting the output of the second NOR gate to the second potential when the digital signal is at the low potential;

a sixth transistor coupled to the low potential for setting the output of the second NOR gate to the low potential when the digital signal is at the first potential;

a seventh transistor coupled to the fifth transistor, the second potential, and the output of said first NOR gate for selectively supplying said second potential to said first transistor in response to a potential of the output of the first NOR gate; and an eighth transistor coupled to the low potential and the first output of the first NOR gate for selectively setting the second output to the low potential in response to the potential of the output of the first NOR gate.

* * * * *